US 6,636,003 B2

(12) United States Patent
Rahm et al.

(10) Patent No.: US 6,636,003 B2
(45) Date of Patent: Oct. 21, 2003

(54) APPARATUS AND METHOD FOR ADJUSTING THE COLOR TEMPERATURE OF WHITE SEMICONDUCT OR LIGHT EMITTERS

(75) Inventors: Peter R. Rahm, Rochester, VT (US); William R. McGrath, Randolph, VT (US)

(73) Assignee: Spectrum Kinetics, Wycombe, PA (US)

( * ) Notice: Subject to any disclaimer, the term of this patent is extended or adjusted under 35 U.S.C. 154(b) by 0 days.

(21) Appl. No.: 09/948,209

(22) Filed: Sep. 6, 2001

(65) Prior Publication Data

US 2002/0048177 A1 Apr. 25, 2002

Related U.S. Application Data

(60) Provisional application No. 60/230,265, filed on Sep. 6, 2000.

(51) Int. Cl.$^7$ .............................................. H05B 35/00
(52) U.S. Cl. ..................... 315/179; 315/291; 362/285; 362/800
(58) Field of Search ............................. 315/178, 179, 315/291, 307, 312, 360, 362; 362/208, 800, 285

(56) References Cited

U.S. PATENT DOCUMENTS

| 5,803,579 A | * | 9/1998 | Turnbull et al. ............ 362/516 |
| 6,095,661 A | * | 8/2000 | Lebens et al. .............. 362/184 |
| 6,299,329 B1 | * | 10/2001 | Mui et al. ................... 362/227 |
| 6,357,893 B1 | * | 3/2002 | Belliveau .................... 362/285 |

* cited by examiner

Primary Examiner—Haissa Philogene
(74) Attorney, Agent, or Firm—Ostrolenk, Faber, Gerb & Soffen, LLP (57) ABSTRACT

An LED arrangement which produces a color temperature adjustable white light. The LED arrangement includes one or more white LEDs and a first drive circuit operable to supply a first drive current to the one or more white LEDs such that a white light is output at a desired intensity. The LED arrangement further includes one or more colored LEDs arranged such that a light output from the one or more colored LEDs combines with the white light to produce a resultant light having a desired color temperature. The colored LEDs are driven by a second drive circuit which supplies a second drive current to the one or more colored LEDs such that a colored light is output at a desired intensity, the intensity of the colored light output from the one or more colored LEDs being adjustable so as to adjust the color temperature of the resultant light.

46 Claims, 6 Drawing Sheets

Figure 6

APPARATUS AND METHOD FOR ADJUSTING THE COLOR TEMPERATURE OF WHITE SEMICONDUCT OR LIGHT EMITTERS

CROSS REFERENCE TO RELATED APPLICATION

This application claims the benefit and priority of U.S. Provisional Application Ser. No. 60/230,265 filed Sep. 6, 2000 entitled "A METHOD FOR ADJUSTING THE COLOR TEMPERATURE OF SEMICONDUCTOR LIGHT EMITTERS".

FIELD OF THE INVENTION

The present invention relates to a semiconductor light emitting diode (LED) array. In particular, the present invention relates to a semiconductor LED array which is adjustable by a user for the selection of a desired color temperature. Also, the present invention relates to a method of selecting a desired color temperature from an array of LEDs.

BACKGROUND OF THE INVENTION

The color temperature of light is typically measured in degrees Kelvin (K). This measurement system was first adapted to measure the temperature of stars. With this color temperature scale, the colder the light, the higher the degrees K, i.e., the hotter the star, the bluer the light output. This temperature scale is also used to measure the light output of other light sources, such as incandescent bulbs, fluorescent lamps and LEDs, to name a few.

To provide the proper contrast for items in an individual's viewing environment, it is desirable to have a white light output from a light source. The use of incandescent bulbs and flourescent lamps have effectively provided such a white light or near white light output. However, there are significant drawbacks to the use of these types of light sources for illumination, such as fragility of the lights themselves and their relatively short lifespan. With incandescent bulbs, for example, their output color temperature will shift toward the red end of the spectrum with a drop in line voltage. Also, changes in the output color temperature due to bulb aging are particularly problematic in color photography or cinematography applications where changes in color temperature due to aging over a very short period (i.e., 48 hours of operation) necessitate the frequent changing of very expensive bulbs.

Because of the drawbacks in the use of incandescent and fluorescent lights, the use of LEDs for illumination has become increasingly popular. However, because LEDs use semiconductor principles of operation to produce light, their light output is typically along a narrow wavelength band, i.e., a single color output. Recent advances, however, have resulted in LEDs which produce a near white light output.

Presently, there are two methods utilized to output white light from LEDs. The first method uses triads of red, green, and blue LEDs. This first method requires a very careful balancing of the brightness of each of the three colors to obtain a white light output. Once the white light output is established, an extremely fine adjustment is then required to obtain the desired color temperature. This is because variations within a fraction of a percent in the intensity of any one color LED will result in a perceptible change in the overall output color temperature of the white light. Further, as the light output of the LEDs vary with age, the ambient temperature changes, and the drive current supplied to the LEDs varies even slightly, the color temperature of the white light will exhibit unwanted fluctuations.

One method for dealing with this problem is to adjust the LEDs for as pure a white light output as possible, and then correct for color temperature using tinted filters. This method ameliorates the color shift problem, but results in significant light losses.

The second method for generating white light is to use a special type of LED which produces a white light output. This special LED produces a white light output by coating the emitting surface of a high intensity blue LED with a phosphor which emits yellow light. The yellow light is emitted as a secondary emission as a result of the phosphor being excited by the photons from the blue LED junction. The spectral output of these devices shows a very high output at the wavelengths in the blue end of the spectrum and a moderate spike in the output at the wavelengths near the yellow portion of the spectrum. Thus, the overall output of the device is a white light with a relatively high color temperature. Such high temperature white LEDs are available from Nichia Chemical Corporation. These white LEDs are available over a range of color temperatures from 5000 deg. K to 8500 deg. K. To obtain lower color temperatures so as to approximate the light from an incandescent lamp, i.e., a color temperature of about 3600 deg. K, a color correcting filter with its attendant light losses must be used.

Therefore, there remains a need for a white light LED which is simple and can be easily adjusted to produce a white light of a desired color temperature.

SUMMARY OF THE INVENTION

The present invention provides an LED arrangement which produces a color temperature adjustable white light. The LED arrangement includes one or more white LEDs, a first drive circuit operable to supply a first drive current to the one or more white LEDs such that a white light is output at a desired intensity. The LED arrangement also includes one or more colored LEDs arranged such that a colored light output from the one or more colored LEDs combines with the white light to produce a resultant light having a desired color temperature. A second drive circuit is provided to supply a second drive current to the one or more colored LEDs such that the colored light is output at a desired intensity. The intensity of the colored light output from the one or more colored LEDs is adjustable such that the color temperature of the resultant light is adjustable.

In the preferred embodiments, the colored LEDs are either amber LEDs, or a combination of red and yellow LEDs. The LEDs used can be either discrete LEDs or "chip-on-board" LEDs.

With this arrangement of LEDs and driver circuits, the color temperature of a white LED can be effectively adjusted without the output color temperature being sensitive to aging, fluctuations in ambient temperature and changes in drive current. The ability of the present invention to effectively adjust the color temperature of the resultant light to reduce the effects aging, fluctuations in ambient temperature and changes in drive current is a result of utilizing the additive properties of light, as opposed to using subtractive properties, such as color filters and their attendant light losses.

Further, the LED arrangement of the present invention allows for the adjustment of the color temperature over a wide range and achieves the desired color temperature even when the intensity of the light varies by several percent in either direction without causing a perceptible change in color temperature.

BRIEF DESCRIPTION OF THE DRAWINGS

Other features and advantages of the present invention will become apparent from the following description of embodiments of the invention which refers to the accompanying drawings, wherein.

DETAILED DESCRIPTION OF EMBODIMENTS OF THE INVENTION

Referring now to the drawings, FIGS. 1A through 3B show plan views of various LED arrangements according to various embodiments of the present invention. In each of FIGS. 1A through 3B, the LEDs 130, 140, 150, 160 are shown as being mounted to a printed circuit board or other suitable substrate 120. In FIGS. 1A through 3B, circles represent cylindrical, or discrete LEDs and rectangles represent surface mount devices, or chip-on-board devices. White LEDs are indicated by reference numeral 130 and an absence of any mark within the outline. Amber LEDs are indicated by reference numeral 140 and a dot (•) within the outline. Yellow LEDs are indicated by reference numeral 150 and a cross (X) within the outline and red LEDs are indicated by reference numeral 160 and a star (★) within the outline.

Figure 4:
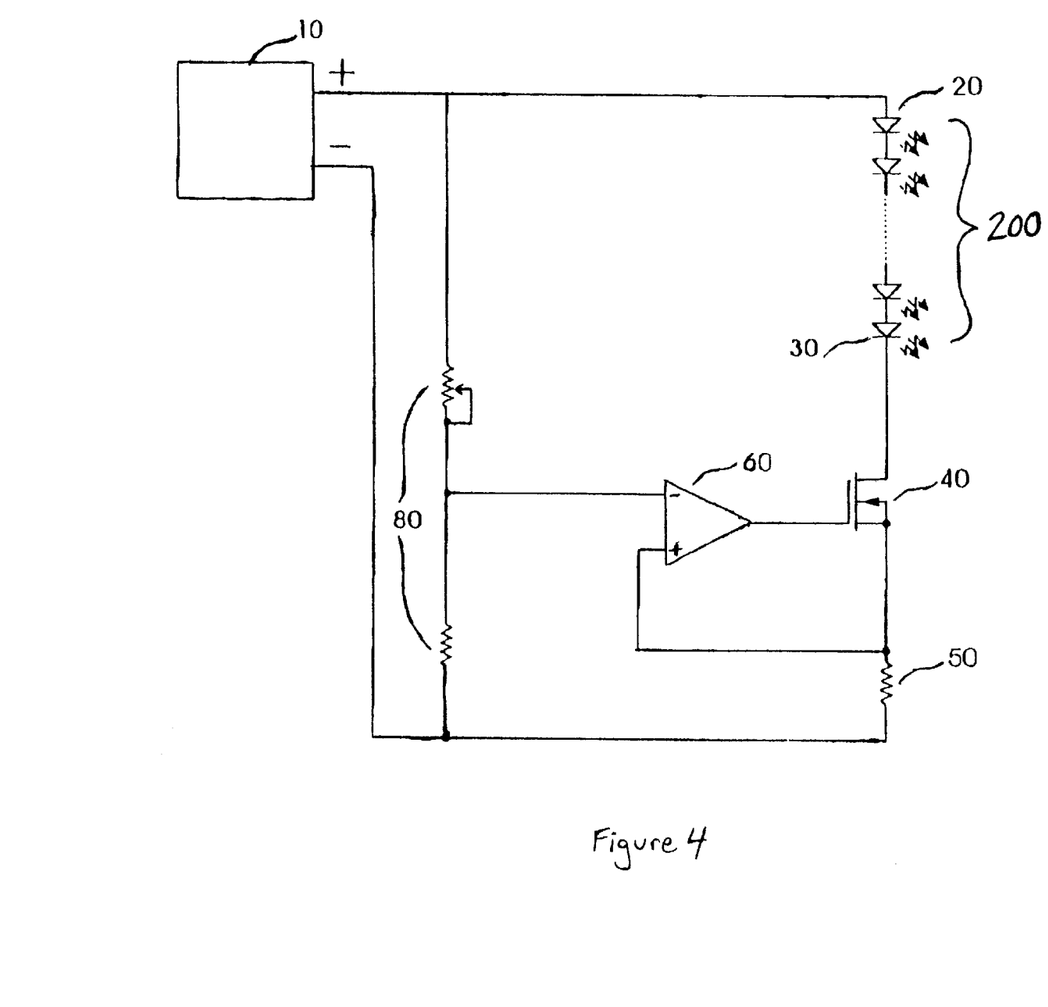
FIG. 4 is a schematic diagram of a constant current drive circuit for use with the LED arrangement of the present invention.
Figure 5:
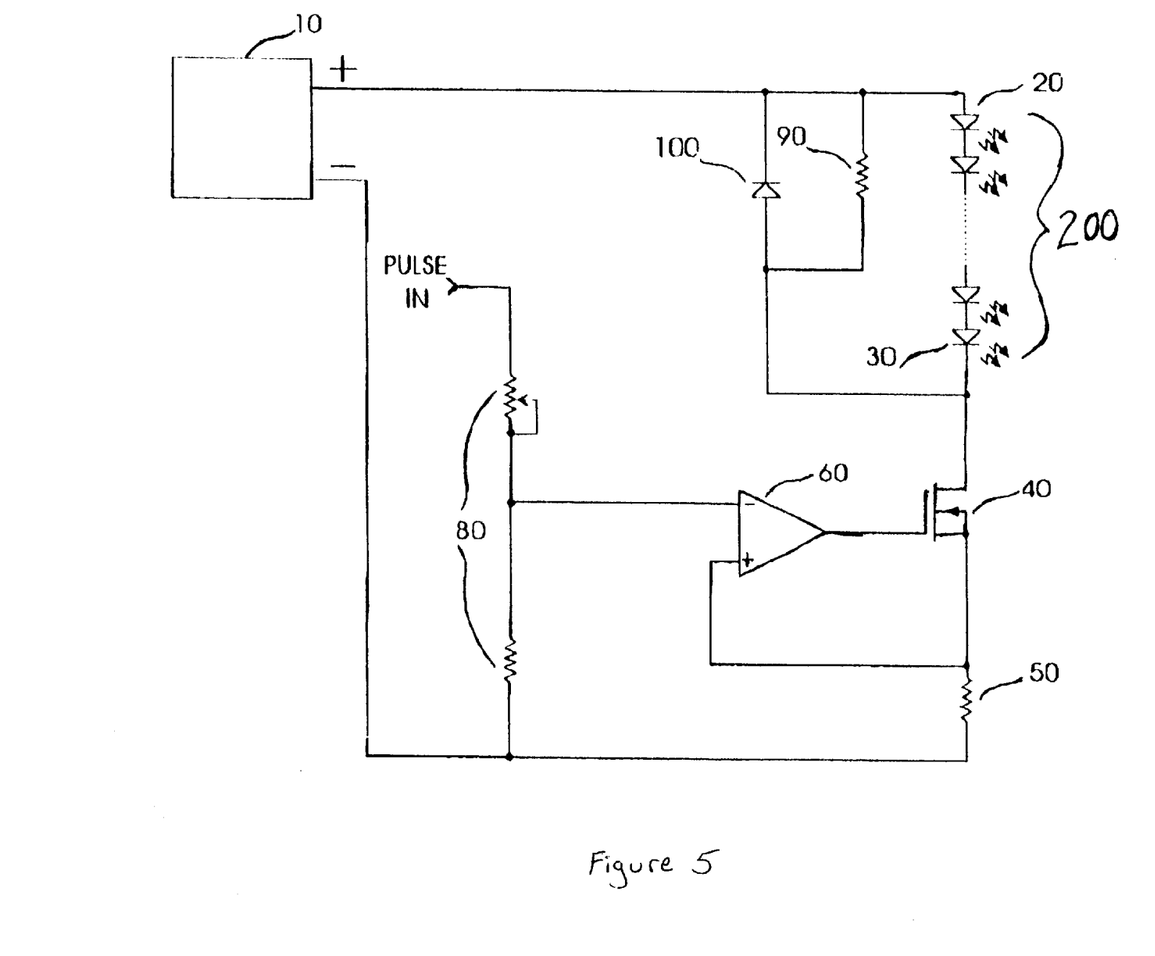
FIG. 5 is a schematic diagram of a pulse width modulated current drive circuit, with active current limiting, for use with the LED arrangement of the present invention.
Figure 6:
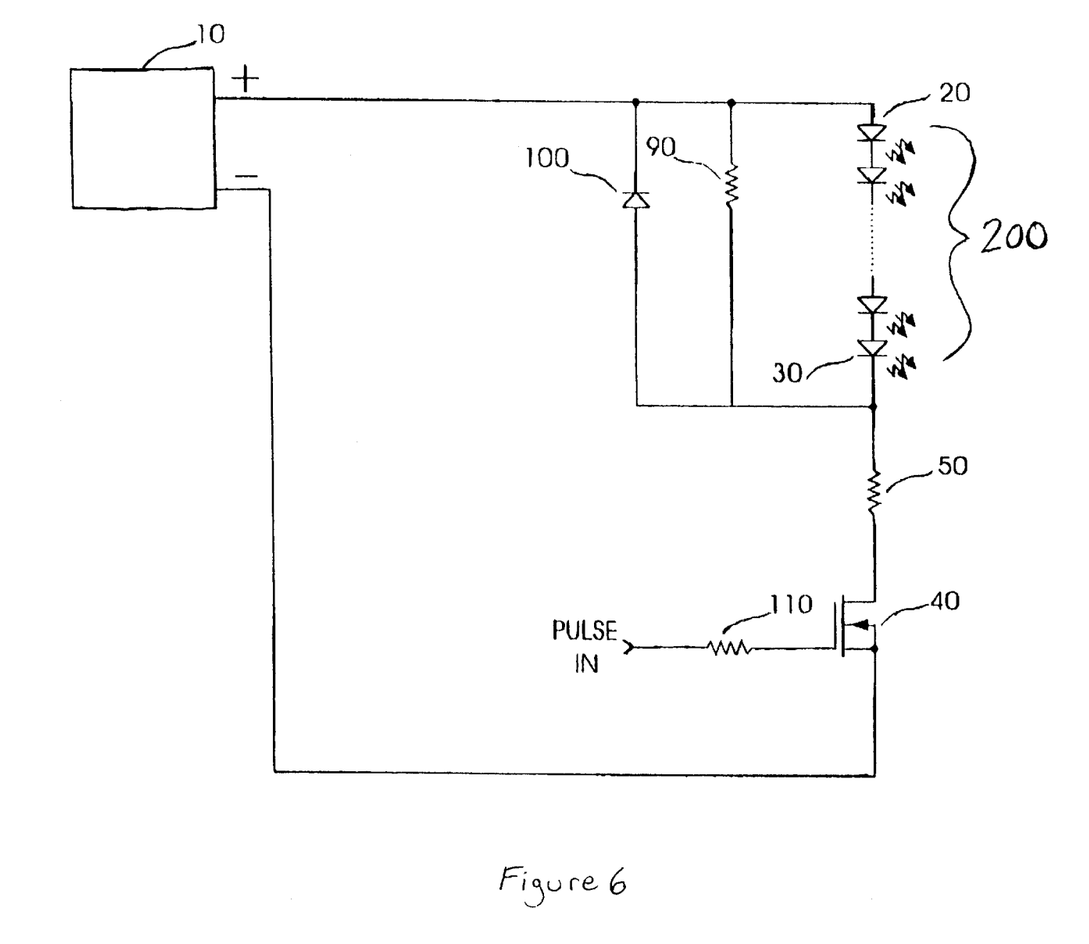
FIG. 6 is a schematic diagram of a pulse width modulated current drive circuit, with passive current limiting, for use with the LED arrangement of the present invention.

The white LEDs 130 are arranged on the substrate 120 so as to be driven by a first drive circuit, such as, for example, one of the circuits shown in FIGS. 4 through 6. The first drive circuit supplies a first drive current to the white LEDs 130 such that a white light is output at a desired intensity. The operation of the drive circuits will be described in greater detail below.

The colored LEDs (i.e., the amber 140, yellow 150 and/or red 160 LEDs) are arranged on the substrate 120 such that a light output from these one or more colored LEDs 140, 150 and/or 160 combines with the white light output from the white LEDs 130 to produce a resultant light having a desired color temperature. A second drive circuit, such, for example, one of the circuits shown in FIGS. 4 through 6, is connected to the colored LEDs 140, 150 and/or 160 so as to supply a second drive current to the colored LEDs 140, 150 and/or 160 such that a colored light is output at a desired intensity. In the embodiments described below, the colored LEDs 140, 150, 160 may be driven by one or more drive circuits such as those shown in FIGS. 4 through 6. For example, if only amber LEDs 140 are used as the colored LEDs, only one drive circuit may be needed. However, if both yellow and red LEDs 150, 160 are used as the colored LEDs, then the yellow and red LEDs 150, 160 may be arranged such that only one drive circuit is needed to supply the drive current thereto, or each of the yellow and red LEDs 150, 160 may be provided with their own independently adjustable drive circuits such that the drive current supplied to the yellow LEDs 150 is independently adjustable relative to the drive current supplied to the red LEDs 160. With either of these colored LED arrangements, the intensity of the colored light output therefrom is adjustable such that the color temperature of the resultant light can be adjusted as desired.

Figure 1A:
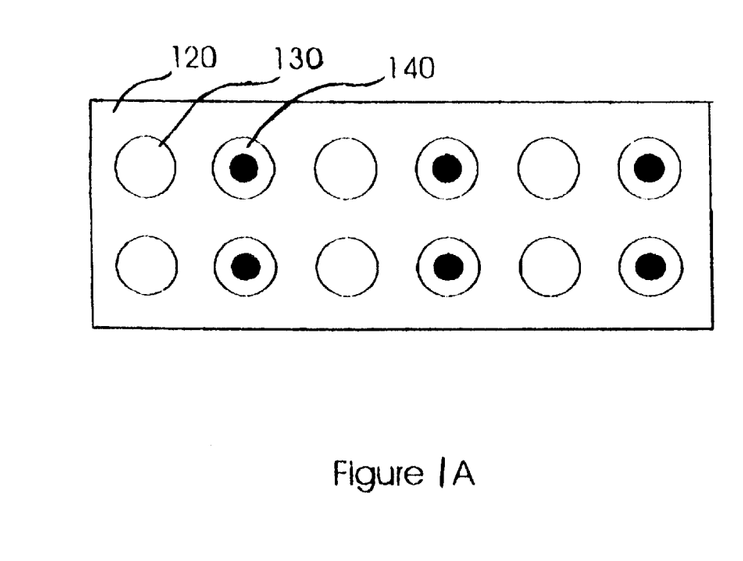
FIGS. 1A and 1B are plan views of various LED arrangement patterns according to a first embodiment of the present invention.

FIG. 1A is a plan view of an array of white LEDs 130 evenly spaced and interleaved with amber 140 LEDs of the same size. The array is repetitive and may be extended indefinitely in either direction. To achieve the desired color temperature, the drive current to the white LEDs 130 is held at a constant level and the drive current to the amber LEDs 140 is adjusted until the desired color temperature is reached. This method effectively balances out the high output spike from the white LEDs 130 in the blue end of the spectrum without requiring the use of colored filter materials. In this embodiment, as in the others whose descriptions follow, the use of the white LEDs 130 with the addition of a warmer color (i.e., amber LEDs 140, or yellow and/or red LEDs 150, 160), results in a simpler and more tolerant adjustment of output white light than that which can be achieved with the red-green-blue LED array of the prior art.

Figure 1B:
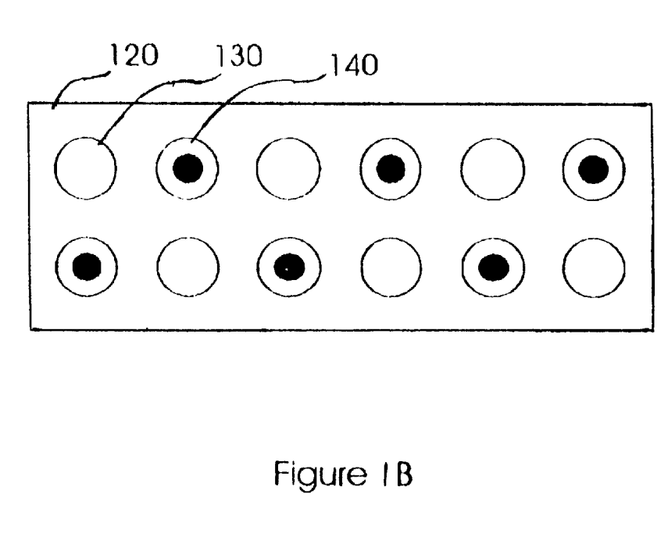

FIG. 1B is a plan view of a staggered array of white LEDs 130 and amber LEDs 140 of the same size. This embodiment is used where a more thorough mixing of the light is required, such as where the light source is closer to the item or target that is to be illuminated.

Figure 2A:
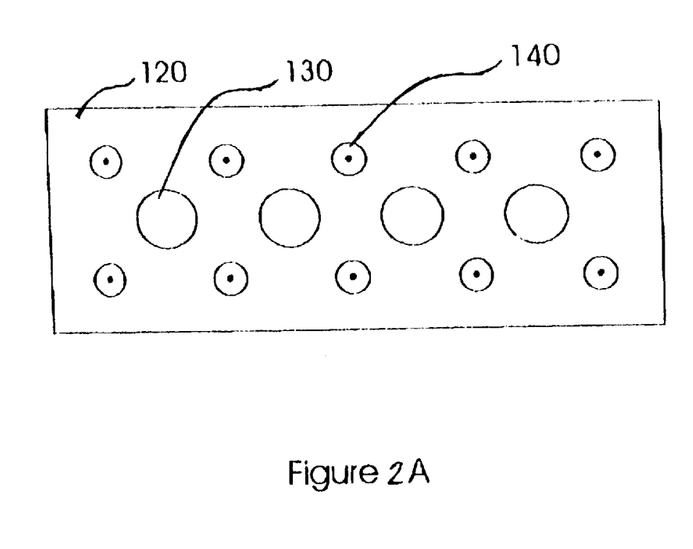
FIGS. 2A and 2B are plan views of various LED arrangement patterns according to a second embodiment of the present invention.

FIG. 2A is a plan view of another LED arrangement according to an embodiment of the present invention. As shown in FIG. 2A, the LED arrangement includes an array of evenly spaced 5 mm diameter white LEDs 130 wherein each white LED 130 is surrounded by four 3 mm diameter amber LEDs 140. This embodiment is used where the closer spacing afforded by the 3 mm devices permits a more compact design of the overall LED arrangement. The increased number of amber LEDs 140 in this embodiment is dictated by the lower light output of these smaller units.

Figure 2B:
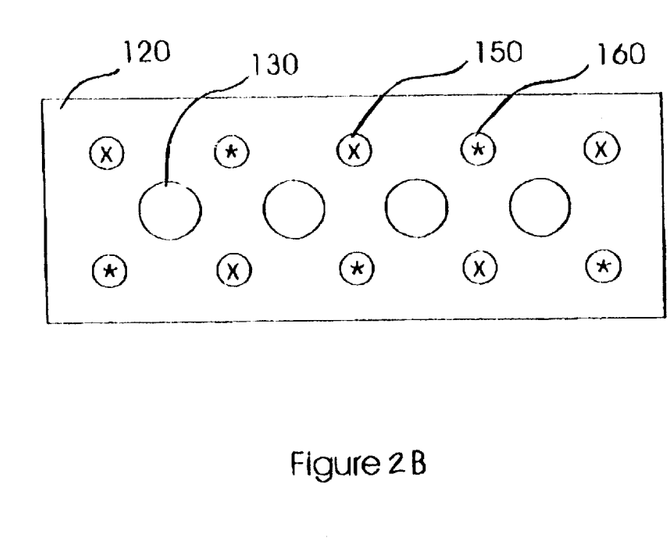

FIG. 2B is a plan view of a further embodiment of an LED arrangement of the present invention. As shown in FIG. 2B, the LED arrangement includes an array of evenly spaced 5 mm diameter white LEDs 130 wherein each white LED 130 is surrounded by alternating pairs of 3 mm red 160 and yellow 150 LEDs. This embodiment is used where a lower color temperature, i.e., with a greater amount of light in the red portion of the spectrum, is required than is obtainable with the amber LED 140 embodiments. In this embodiment, the drive current to the white LEDs 130 is held constant and the drive currents to the yellow and red LEDs 150, 160 are adjustable together or independently of one another.

Figure 3A:
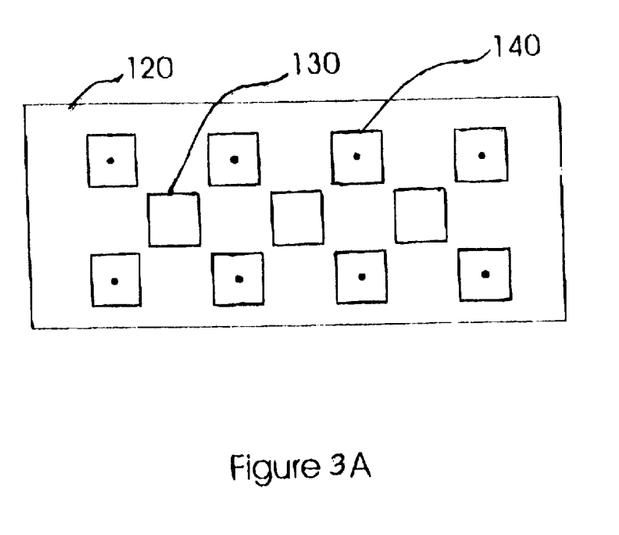
FIGS. 3A and 3B are plan views of various LED arrangement patterns according to a third embodiment of the present invention.
Figure 3B:
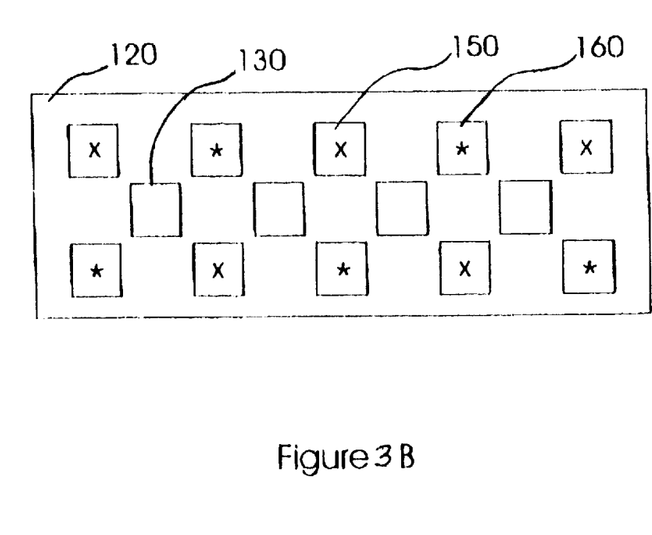

FIG. 3A is a plan view of an LED arrangement wherein all the LEDs in the array are surface mount devices and a mixture of white LEDs 130 and amber LEDs 140 are used. FIG. 3B shows an LED arrangement similar to that of FIG. 3A except that yellow LEDs 150 and red LEDs 160 are used in the array in place of the amber LEDs 140. The embodiments shown in FIGS. 3A and 3B are preferred where an extremely low profile lighting device is desired.

The operation of the various LED arrangements of the present invention will now be described in detail while referencing FIGS. 1A through 6. In the circuit diagrams of FIGS. 4 through 6, the LEDs are referred to generally as reference numeral 200. Reference numeral 200 represents either the white LEDs 130 or the colored LEDs 140, 150, 160 as provided within the drive circuit. In other words, reference numeral 200 indicates the location of the white LEDs 130, the amber LEDs 140, or the yellow and/or red LEDs 150, 160 within the drive circuit.

With the present LED arrangement, the white LEDs 130 are provided with a first drive circuit which supplies an adjustable constant drive current thereto, while the colored LEDs (i.e., either the amber LEDs 140, or the yellow and red LEDs 150, 160) are provided with a second drive circuit. The drive circuit for the white LEDs 130 preferably supplies a constant drive current to the white LEDs 130 and is preferably capable of being adjusted such that the intensity (brightness) of the emitted white light can be varied. The colored LEDs 140, 150, 160 are preferably provided with a second drive circuit which supplies a drive current to the colored LEDs 140, 150, 160 which is also adjustable such that the intensity of the output colored light can be varied and thereby provide the proper mix of colored and white light so as to achieve the desired color temperature. Examples of suitable drive circuits and their operation will be described below with reference to FIGS. 4 through 6.

FIG. 4 shows one type of current drive circuit for use with the LED arrangements shown in FIGS. 1A through 3B of the present invention. In particular, FIG. 4 shows an adjustable constant current drive circuit for a string of LEDs 200. In FIG. 4, reference numeral 10 denotes a DC power source. The DC power source 10 provides a positive voltage to the uppermost anode 20 of the one or more LEDs 200. Preferably, the string of LEDs 200 are connected in series. However, when more than one string of LEDs are used, each of the LEDs in the string can be connected in 110 series and then each string can be connected in parallel. Due to the differences in the forward voltage drops of different LEDs, the length of the series strings will be determined by the supply voltage. For example, in a 24 $V_{DC}$ circuit, series strings of five white LEDs 130 would be paralleled and connected to their respective driver, and a series strings of ten yellow or red LEDs 150, 160 would be paralleled and connected to their respective driver.

Returning to FIG. 4, the lowermost cathode 30 in the string of one or more LEDs 200 is preferably connected to the drain of an N channel field effect transistor (FET) 40. The source of the FET 40 is returned to the negative side of the DC power source 10 through resistor 50. The gate of the FET 40 is driven by an operational amplifier 60. The inverting input of the amplifier 60 is connected to the source of the FET 40, and the non-inverting input is connected to a voltage source through variable resistive divider 80.

The operational amplifier 60 provides a voltage proportional to the desired LED current by the voltage divider 80. By varying the voltage from the voltage divider 80, the current is varied. In other words, the voltage from the voltage divider 80 sets the operating current for the string of LEDs 200. The operational amplifier 60 supplies a drive voltage to the gate of the FET 40 causing it to conduct current. When the voltage across the current sense resistor 50 is equal to the voltage provided by voltage divider 80, the amplifier 60 maintains the drive voltage level. By selecting the ratio of the two resistors comprising the voltage divider 80, the desired output current can be selected and will remain constant, independent of changes in the output voltage of the DC source 10 or changes in the forward voltage drop of the LEDs 200. With this drive circuit, the drive current of the LEDs 200 can be adjusted to a desired level and held constant at that level. The nature of this drive circuit is such that it will adjust its drive to maintain the constant drive current. Thus, if the power supply 10 voltage changes or the forward voltage drop across the LEDs 200 changes with time and/or temperature, the operational amplifier 60 will adjust its drive accordingly so as to maintain a constant current.

FIG. 5 shows a second type of current drive circuit for use with the LED arrangement of the present invention. In particular, FIG. 5 shows a pulse width modulated drive circuit with active current limiting. The circuit of FIG. 5 is basically the same as that of FIG. 4, except that the non-inverting input of the operational amplifier 60 is driven by positive-going pulses through a resistive voltage divider 80. In other words, the voltage being used to determine the current is pulsed rather that being provided at a DC level. In this configuration, an additional resistor 90 and a diode 100 are connected in parallel with the series string of LEDs 200.

The drive circuit of FIG. 5 permits the adjustment of the current supplied to the LEDs 200, and thus the intensity of the light emitted by the LEDs 200. This circuit permits adjustment by varying the duty cycle of a pulse stream driving the operational amplifier 60. In this circuit, the drive to the FET 40 is established when the voltage across the sense resistor 50 is equal to the amplitude of the input pulse. In this embodiment, the brightness of the LEDs 200 are determined by the average current through the LEDs 200. For example, if the pulse is such that the FET 40 is conducting 50% of the time, the average current will be 12 the peak current. This type of brightness control is particularly suitable when a microprocessor is used as a programmable control element to adjust the light output of the LEDs 200.

When the operational amplifier 60 is operating from a single, positive supply voltage, its output can be a slightly positive voltage even though the pulse input voltage is zero volts during the "off" portion of the duty cycle. This slight positive voltage causes FET 40 to conduct sufficient current to permit the LEDs 200 to emit a small amount of light. At a low current, the voltage drop across resistor 90 is much smaller than the forward voltage drop across the LEDs 200. For this reason, the LEDs 200 will be back-biased in this condition and will turn off completely.

Because the operational amplifier 60 and the FET 40 are high speed devices, inductive spikes may be introduced at the leading and trailing edges of the drive pulse. The more distant the LEDs 200 are from the driver, and thus the longer the connecting wires, the greater the spikes become in amplitude. The addition of the diode 100 clamps the output of the drive circuit to the supply voltage 10 to protect the LEDs 200 and the FET 40. The generation of the inductive spike may be reduced by slowing down the switching speed of FET 40. This may be accomplished, for example, by placing a capacitor from the gate of the FET 40 to ground (not shown). This may, however, result in undesirable switching losses.

FIG. 6 shows a third type of current drive circuit for use with the LED arrangement of the present invention. In particular, FIG. 6 shows a pulse width modulated drive circuit with passive current limiting. The circuit of FIG. 6 is similar to that of FIG. 5, except that the operational amplifier is omitted and FET 40 is driven directly by the positive-going pulses through a resistor 110. Accordingly, there is no feedback in the circuit to maintain a constant current. This circuit is useful in applications where some current variation is allowable and cost is a primary consideration. In this embodiment, the variation in current will be due primarily to changes in the supply voltage. Accordingly, if the LEDs 200 are operated from a well-regulated power supply 10, the current variations will be minor.

In the drive circuit of FIG. 6, resistor 50 acts as a passive current limiter. This drive circuit can be used where the regulation of the LED current against changes in input voltage, forward voltage drop, etc., is not critical enough to justify more complex circuitry. Resistor 90 and diode 100 are incorporated to prevent small leakage currents that may keep the LEDs 200 from conducting and to protect against inductive spikes. Resistor 110 protects the FET 40 from being overdriven.

With the above arrangement of drive circuits and LED components, the light from one or more white LEDs can be adjusted to a color temperature between from about 2500–5000 degrees Kelvin. In a preferred embodiment, the color temperature of the white light is set to about 3600 degrees Kelvin. Additionally, because of the means used to achieve the lower color temperature described above, the intensity of the light can vary by several percent without causing a perceptible change in color temperature.

Further, the above arrangement of drive circuits and LED components provides an additive means of producing white light having a lower color temperature with little or no color loss, rather than a subtractive means such as that provided by use of colored filters and any attendant color losses associated therewith. The above arrangement, by ensuring a constant drive current to the LEDs, significantly reduces the sensitivity of the resultant color temperature to aging, ambient temperature, etc.

Although the description above contains several specific patterns and mixtures of case sizes, shapes, etc., these should not be construed as limiting the scope of the invention but as merely providing illustrations of some of the currently preferred embodiments. For example, the LEDs may be arranged in circular or other shaped patterns. In some applications, the 3 mm and 5 mm cylindrical LEDs may be mixed with surface mount units to obtain a desired effect.

Further, although various specific circuit configurations have been shown and described above, there are numerous driving circuits which can be utilized with the present invention, the specific design of which will be evident to one of skill in the art given the detailed description herein. For example, each of the circuits described herein can be modified to operate from an AC voltage source by designing the DC power source as an AC/DC converter. Also, even though not shown in the figures, the drive circuits can be configured to be manually adjustable or adjustable with a programmable microprocessor.

Thus, although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A temperature adjustable LED arrangement comprising:
    at least one white LED;
    a first drive circuit operable to supply a first drive current to the at least one white LED such that a white light is output at a first intensity;
    at least one colored LED arranged such that a colored light is output from the at least one colored LED and combines with the white light to produce a resultant light having a color temperature; and
    a second drive circuit operable to supply a second drive current to the at least one colored LED such that the colored light is output at a second intensity, the second drive circuit being adjustable so as to adjust a level of the second drive current supplied so as to vary the color temperature of the resultant light; wherein the color temperature of the resultant light is adjustable between about 2500 to about 5000 degrees Kelvin.

2. The LED arrangement according to claim 1, wherein the first drive circuit is adjustable so as to adjust a level of the first drive current supplied to the at least one white LED so as to vary the brightness of the white light.

3. The LED arrangement according to claim 1, wherein the at least one colored LED is an amber LED.

4. The LED arrangement according to claim 1, wherein the at least one colored LED is a combination of red and yellow LEDs.

5. The LED arrangement according to claim 1, wherein the first drive circuit is a pulse width modulated drive circuit with active current limiting.

6. The LED arrangement according to claim 5, wherein the second drive circuit is a pulse width modulated drive circuit with active current limiting.

7. The LED arrangement according to claim 1, wherein the second drive circuit is a pulse width modulated drive circuit with active current limiting.

8. The LED arrangement according to claim 1, wherein the first drive circuit is a pulse width modulated drive circuit with passive current limiting.

9. The LED arrangement according to claim 5, wherein the second drive circuit is a pulse width modulated drive circuit with passive current limiting.

10. The LED arrangement according to claim 1, wherein the second drive circuit is a pulse width modulated drive circuit with passive current limiting.

11. The LED arrangement according to claim 1, wherein the at least one white LED is a discrete LED.

12. The LED arrangement according to claim 11, wherein the at least one white LED is mounted on a printed circuit board.

13. The LED arrangement according to claim 1, wherein the at least one white LED is a chip-on-board LED.

14. The LED arrangement according to claim 1, wherein the at least one white LED comprises at least two white LEDs arranged in series.

15. The LED arrangement according to claim 1, wherein the at least one colored LED is a discrete LED.

16. The LED arrangement according to claim 15, wherein the at least one colored LED is mounted on a printed circuit board.

17. The LED arrangement according to claim 1, wherein the at least one colored LED is a chip-on-board LED.

18. The LED arrangement according to claim 1, wherein the at least one colored LED comprises at least two colored LEDs arranged in series.

19. The LED arrangement according to claim 1, wherein the color temperature of the resultant light is adjustable to about 3600 degrees Kelvin.

20. A method of adjusting the color temperature of light output from an LED arrangement, the method comprising:
    supplying a first drive current to at least one white LED such that a white light is output at a first intensity;
    supplying a second drive current to at least one colored LED such that a colored light is output at a second intensity;
    combining the white light with the colored light to produce a resultant light having a desired color temperature; and
    adjusting the color temperature of the resultant light by adjusting the second intensity of the colored light;

wherein the color temperature of the resultant light is adjusted between about 2500 to about 5000 degrees Kelvin.

21. The method of adjusting the color temperature of light output from an LED arrangement according to claim 20, wherein the color temperature of the resultant light is adjusted to about 3600 degrees Kelvin.

22. A temperature adjustable LED arrangement comprising:
at least one white LED;
a first drive circuit operable to supply a first drive current to the at least one white LED such that a white light is output at a first intensity;
at least one red LED arranged to output a red light that combines with the white light;
a second drive circuit operable to supply a second drive current to the at least one red LED such that the red light is output at a second intensity;
at least one yellow LED arranged to output a yellow light that combines with the white light and the red light to produce a resultant light having a color temperature;
a third drive circuit operable to supply a third drive current to the at least one yellow LED such that the yellow light is output at a third intensity,
the second drive circuit being adjustable so as to adjust a level of the second drive current supplied to the at least one red LED and the third drive circuit being adjustable so as to adjust a level of the third drive current supplied to the at least one yellow LED so as to vary the color temperature of the resultant light; wherein the color temperature of the resultant light is adjustable between about 2500 to about 5000 degrees Kelvin.

23. The LED arrangement according to claim 22, wherein the at least one white LED is a discrete LED.

24. The LED arrangement according to claim 23, wherein the at least one white LED is mounted on a printed circuit board.

25. The LED arrangement according to claim 22, wherein the at least one white LED is a chip-on-board LED.

26. The LED arrangement according to claim 22, wherein the at least one white LED comprises at least two white LEDs arranged in series.

27. The LED arrangement according to claim 22, wherein the at least one red LED and the at least one yellow LED are discrete LEDs.

28. The LED arrangement according to claim 27, wherein the at least one red LED and the at least one yellow LED are mounted on a printed circuit board.

29. The LED arrangement according to claim 22, wherein the at least one red LED and the at least one yellow LED are chip-on-board LEDs.

30. The LED arrangement according to claim 22, wherein the at least one red LED comprises at least two red LEDs arranged in series.

31. The LED arrangement according to claim 30, wherein the at least one yellow LED comprises at least two yellow LEDs arranged in series.

32. The LED arrangement according to claim 22, wherein the first drive circuit is adjustable so as to adjust a level of the first drive current supplied to the at least one white LED so as to vary the brightness of the white light.

33. The LED arrangement according to claim 22, wherein the color temperature of the resultant light is adjustable to about 3600 degrees Kelvin.

34. A temperature adjustable LED arrangement comprising:
at least one white LED which outputs a white light;
at least one colored LED which outputs a colored light, the at least one colored LED being arranged at a distance from the at least one white LED such that the output colored light combines with the output white light to produce a resultant light having a color temperature; wherein the color temperature of the resultant light is adjustable between about 2500 to about 5000 degrees Kelvin.

35. The LED arrangement according to claim 34, wherein an intensity of the output colored light is adjustable so as to vary the color temperature of the resultant light.

36. The LED arrangement according to claim 34, wherein the at least one colored LED is a chip-on-board LED.

37. The LED arrangement according to claim 34 wherein the color temperature of the resultant light is adjustable to about 3600 degrees Kelvin.

38. The LED arrangement according to claim 35, wherein an intensity of the output white light is adjustable so as to vary the brightness of the resultant light.

39. The LED arrangement according to claim 34, wherein an intensity of the output white light is adjustable so as to vary the brightness of the output white light.

40. The LED arrangement according to claim 34, wherein the at least one colored LED is an amber LED.

41. The LED arrangement according to claim 34, wherein the at least one colored LED is a combination of red and yellow LEDs.

42. The LED arrangement according to claim 34, wherein the at least one white LED is a discrete LED.

43. The LED arrangement according to claim 42, wherein the at least one white LED is mounted on a printed circuit board.

44. The LED arrangement according to claim 34, wherein the at least one white LED is a chip-on-board LED.

45. The LED arrangement according to claim 34, wherein the at least one colored LED is a discrete LED.

46. The LED arrangement according to claim 45, wherein the at least one colored LED is mounted on a printed circuit board.

* * * * *